United States Patent
Tzai et al.

(10) Patent No.: US 9,007,571 B2
(45) Date of Patent: Apr. 14, 2015

(54) MEASUREMENT METHOD OF OVERLAY MARK

(71) Applicant: United Microelectronics Corp., Hsinchu (TW)

(72) Inventors: Wei-Jhe Tzai, Pingtung County (TW); Kuei-Chun Hung, Hsinchu (TW); Chun-Chi Yu, Taipei (TW); Chien-Hao Chen, Tainan (TW); Chia-Ching Lin, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 94 days.

(21) Appl. No.: 13/971,776

(22) Filed: Aug. 20, 2013

(65) Prior Publication Data

US 2015/0055125 A1 Feb. 26, 2015

(51) Int. Cl.
*G01N 21/00* (2006.01)
*G03F 9/00* (2006.01)

(52) U.S. Cl.
CPC .................. *G03F 9/7088* (2013.01)

(58) Field of Classification Search
USPC ........................................... 356/72–73
See application file for complete search history.

(56) References Cited

U.S. PATENT DOCUMENTS

| | | | |
|---|---|---|---|
| 6,440,759 B1 | 8/2002 | Commons et al. | |
| 7,440,105 B2 | 10/2008 | Adel et al. | |
| 7,804,994 B2 | 9/2010 | Adel et al. | |
| 7,879,627 B2 | 2/2011 | Ghinovker et al. | |
| 8,148,682 B2 | 4/2012 | Hotta et al. | |
| 2004/0233444 A1* | 11/2004 | Mieher et al. | 356/401 |
| 2011/0096309 A1 | 4/2011 | Wiaux et al. | |

* cited by examiner

*Primary Examiner* — Abdullahi Nur
(74) *Attorney, Agent, or Firm* — J.C. Patents (57) ABSTRACT

A measurement method of an overlay mark is provided. An overlay mark on a wafer is measured with a plurality of different wavelength regions of an optical measurement tool, so as to obtain a plurality of overlay values corresponding to the wavelength regions. The overlay mark on the wafer is measured with an electrical measurement tool to obtain a reference overlay value. The wavelength region that corresponds to the overlay value closest to the reference overlay value is determined as a correct wavelength region for the overlay mark.

19 Claims, 9 Drawing Sheets

MEASUREMENT METHOD OF OVERLAY MARK

BACKGROUND OF THE INVENTION

1. Field of Invention

The present invention relates to an integrated circuit (IC) fabrication, and particularly to a measurement method of an overlay mark for checking the alignment accuracy between layers on a wafer.

2. Description of Related Art

As the level of integration of integrated circuits is increased, the demand for increasing the feature density or reducing the pitch size becomes the mainstream in the semiconductor industry, and the key technology is in photolithography. In the photolithography module, the patterns are transferred from a photomask to a wafer, so that the accuracy in the pattern transferring process is quite important. Therefore, an overlay mark is generally formed on a wafer to check the alignment accuracy between layers.

The existing overlay measurement is an optical image based measurement. The accuracy of the measurement is usually affected by processes including chemical mechanical polishing (CMP), etching, gap fill, film topography, etc. However, it has been difficult to prove the overlay measurement results.

SUMMARY OF THE INVENTION

Accordingly, the present invention provides a measurement method of an overlay mark, with which a correct wavelength region of an optical overlay tool for the overlay mark is determined. Therefore, the overlay data is reliable and accurate since the overlay mark is measured with the correct wavelength region.

The present invention provides a measurement method of an overlay mark. An overlay mark on a wafer is measured with a plurality of different wavelength regions of an optical measurement tool, so as to obtain a plurality of overlay values corresponding to the wavelength regions. The overlay mark on the wafer is measured with an electrical measurement tool to obtain a reference overlay value. The wavelength region that corresponds to the overlay value closest to the reference overlay value is determined as a correct wavelength region for the overlay mark.

According to an embodiment of the present invention, any two adjacent wavelength regions partially overlap with each other.

According to an embodiment of the present invention, the wavelength regions are all between 200 nm to 700 nm.

According to an embodiment of the present invention, the electrical measurement tool includes a CD-SEM, a cross-sectional SEM, a TEM, an atomic force microscope (AFM) or a high resolution profiler (HRP).

According to an embodiment of the present invention, the overlay mark includes a plurality of first patterns of a previous layer and a plurality of second patterns of a current layer, and first ends of the first patterns and second ends of the second patterns are arranged alternately or overlap with each other.

According to an embodiment of the present invention, when the first and second patterns are line patterns, the first ends of the first patterns and the second ends of the second patterns are arranged alternately.

According to an embodiment of the present invention, when the first and second patterns are line patterns, the first ends of the first patterns and the second ends of the second patterns overlap with each other, and a dimension of the first patterns is greater than a dimension of the second patterns.

According to an embodiment of the present invention, when the first patterns are plug patterns and the second patterns are line patterns, the first ends of the first patterns and the second ends of the second patterns overlap with each other, and a dimension of the first patterns is greater than a dimension of the second patterns.

According to an embodiment of the present invention, when the first patterns are plug patterns and the second patterns are space patterns, the first ends of the first patterns and the second ends of the second patterns overlap with each other, and a dimension of the first patterns is smaller than a dimension of the second patterns.

According to an embodiment of the present invention, when the first patterns are line patterns and the second patterns are space patterns, the first ends of the first patterns and the second ends of the second patterns overlap with each other, and a dimension of the first patterns is smaller than a dimension of the second patterns.

According to an embodiment of the present invention, the first patterns are substantially arranged symmetrical with respect to a central point, and the second patterns are substantially arranged symmetrical with respect to the central point.

According to an embodiment of the present invention, a dimension of the first patterns is proportional to a critical dimension of the previous layer, and a dimension of the second patterns is proportional to a critical dimension of the current layer.

According to an embodiment of the present invention, a dimension of the first patterns is a critical dimension of the previous layer, and a dimension of the second patterns is a critical dimension of the current layer.

According to an embodiment of the present invention, the wafer is selected from a batch of wafers, and the measurement method further includes measuring another overlay mark on another wafer of the batch of wafers with the correct wavelength region.

According to an embodiment of the present invention, the overlay value comprises a first overlay value in a first direction and a second overlay value in a second direction different from the first direction.

According to an embodiment of the present invention, the second direction is perpendicular to the first direction.

According to an embodiment of the present invention, the first overlay value is different from the second overlay value.

According to an embodiment of the present invention, the overlay value comprises an X-direction overlay value and a Y-direction overlay value.

According to an embodiment of the present invention, the X-direction overlay value is different from the Y-direction overlay value.

In view of the above, the overlay mark of the invention can be measured by both an optical overlay tool and an electrical measurement tool. Besides, a correct wavelength region of the optical overlay tool for the overlay mark can be determined with the method of the invention. Therefore, the overlay data is reliable and accurate since the overlay mark is measured with the correct wavelength region.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1:
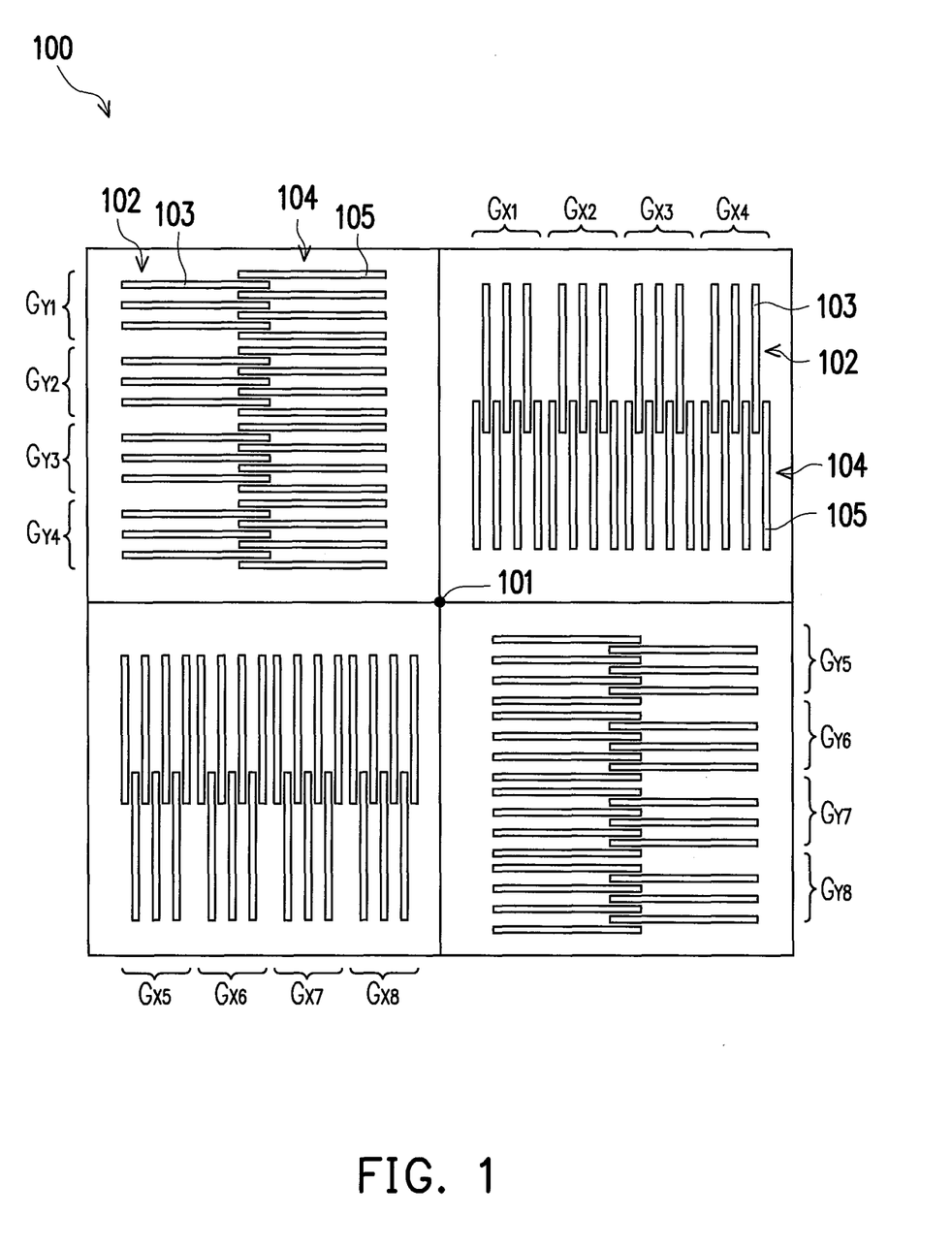
FIG. 1 illustrates a schematic top view of an overlay mark according to a first embodiment of the present invention.

FIG. 1 illustrates a schematic top view of an overlay mark according to a first embodiment of the present invention.

Referring to FIG. 1, the overlay mark 100 of the invention includes a plurality of patterns 103 of a previous layer 102 and a plurality of patterns 105 of a current layer 104. The patterns 103 of the previous layer 102 are substantially arranged symmetrical with respect to a central point 101, and the second patterns 105 of the current layer 104 are substantially arranged symmetrical with respect to the central point 101. By such substantially symmetrical design, the overlay mark 100 can be used to measure the alignment accuracy between layers with an optical measurement tool. The optical tool can be a KLA optical measurement tool.

Besides, the patterns 103 of the previous layer 102 and the patterns 105 of the current layer 104 are divided into, for example but not limited to, sixteen groups $G_{X1}, G_{X2}, \ldots, G_{X8}$ and $G_{Y1}, G_{Y1}, \ldots, G_{Y1}$, as shown in FIG. 1. The groups $G_{X1}, G_{X2}, \ldots, G_{X8}$ are designed to measure the X-direction overlay value, and the groups $G_{Y1}, G_{Y2}, \ldots, G_{Y8}$ are designed to measure the Y-direction overlay value. For each group, the space between the adjacent two patterns 103 is constant, and the space between the adjacent two patterns 105 is constant.

In this embodiment, the patterns 103 and 105 are line patterns, and ends of the patterns 103 and ends of the patterns 105 are arranged alternately. Each group has, for example but not limited to, three patterns 103 of the previous layer 102 and four patterns 105 of the current layer 104. The number of patterns 103 and 105 are not limited by the present invention and can be adjusted upon the process requirements.

By such alternately arranged design, the overlay mark 100 can be used to measure the alignment accuracy between layers with an electrical measurement tool. The electrical measurement tool can be a CD-SEM, a cross-sectional SEM, a TEM, an atomic force microscope (AFM) or a high resolution profiler (HRP).

Figure 1A:
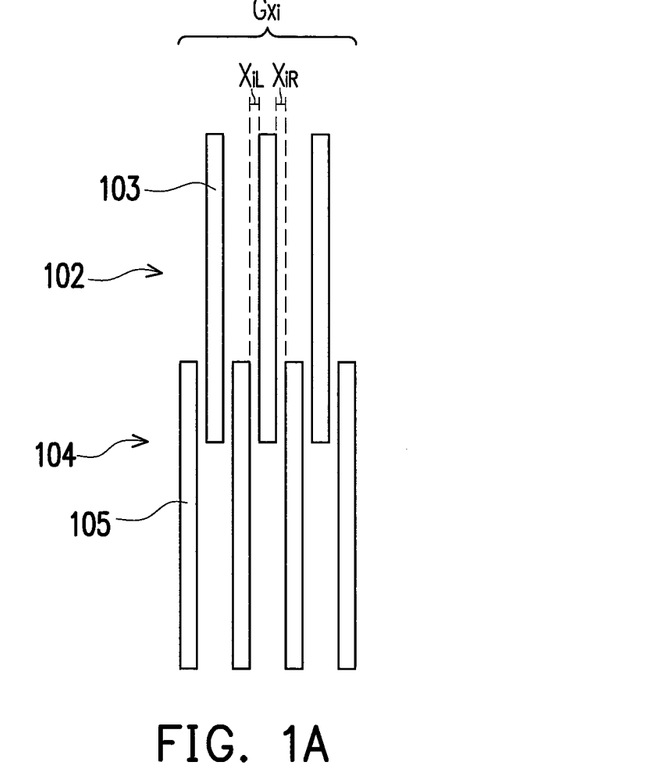
FIG. 1A illustrates an enlarged view of the group Xi of the overlay mark of the first embodiment.
Figure 1B:
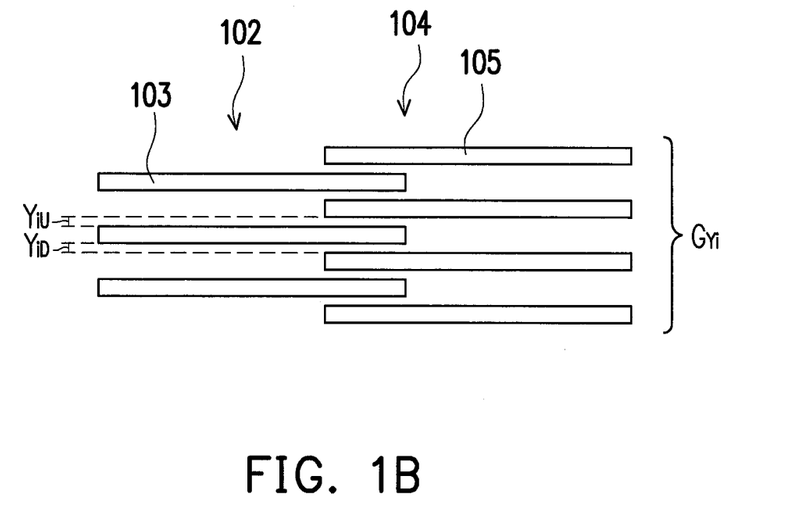
FIG. 1B illustrates an enlarged view of the group Yi of the overlay mark of the first embodiment.

How to obtain the overlay data of the overlay mark 100 with the electrical measurement tool is described in the following. FIG. 1A illustrates an enlarged view of the group Xi of the overlay mark 100. FIG. 1B illustrates an enlarged view of the group Yi of the overlay mark 100.

Referring to FIG. 1A, the X-direction overlay value of group $G_{Xi}$ (overlay $X_i$) is calculated by the following equation:

$$\text{Overlay } X_i = (X_{iR} - X_{iL})/2$$

wherein $X_{iR}$ is a distance from a boundary of a pattern 103 to the adjacent pattern 105 at the right-hand side, $X_{iL}$ is a distance from another boundary of the pattern 103 to the adjacent pattern 105 at the left-hand side, and i is an positive integer.

When overlay mark 100 has N groups for measuring the X-direction overlay value, the average X-direction overlay value (Overlay $X_{AVE}$) can be calculated by the following equation:

$$\text{Overlay } X_{AVE} = (X_1 + X_2 + \ldots + X_N)/N$$

wherein N is a positive integer.

Similarly, Referring to FIG. 1B, the Y-direction overlay value of group $G_{Yi}$ (overlay $Y_i$) is calculated by the following equation:

$$\text{Overlay } Y_i = (Y_{iU} - X_{iD})/2$$

wherein $Y_{iU}$ is a distance from a boundary of a pattern 103 to the adjacent pattern 105 at the up side, $Y_{iD}$ is a distance from another boundary of the pattern 103 to the adjacent pattern 105 at the down side, and i is an positive integer.

When overlay mark 100 has N groups for measuring the Y-direction overlay value, the average Y-direction overlay value (Overlay $Y_{AVE}$) can be calculated by the following equation:

$$\text{Overlay } Y_{AVE} = (Y_1 + Y_2 + \ldots + Y_N)/N$$

wherein N is a positive integer.

In the embodiment of FIG. 1, the overlay mark 100 has eight groups ($G_{X1}, G_{X2}, \ldots, G_{X8}$) for measuring the X-direction overlay value and eight groups ($G_{Y1}, G_{Y2}, \ldots, G_{Y8}$) for measuring the Y-direction overlay value, so that the average X-direction overlay value (Overlay $X_{AVE}$) and the average Y-direction overlay value (Overlay $Y_{AVE}$) can be calculated by the following equations:

$$\text{Overlay } X_{AVE} = (X_1 + X_2 + X_3 + X_4 + X_5 + X_6 + X_7 + X_8)/8$$

$$\text{Overlay } Y_{AVE} = (Y_1 + Y_2 + Y_3 + Y_4 + Y_5 + Y_6 + Y_7 + Y_8)/8$$

The said embodiment in which ends of the patterns 103 of the previous layer 102 and ends of the patterns 105 of the current layer 104 are arranged alternately are provided for illustration purposes, and are not construed as limiting the present invention. In another embodiment, ends of the patterns 103 of the previous layer 102 and ends of the patterns 105 can be designed to overlap with each other.

Second Embodiment

Figure 2:
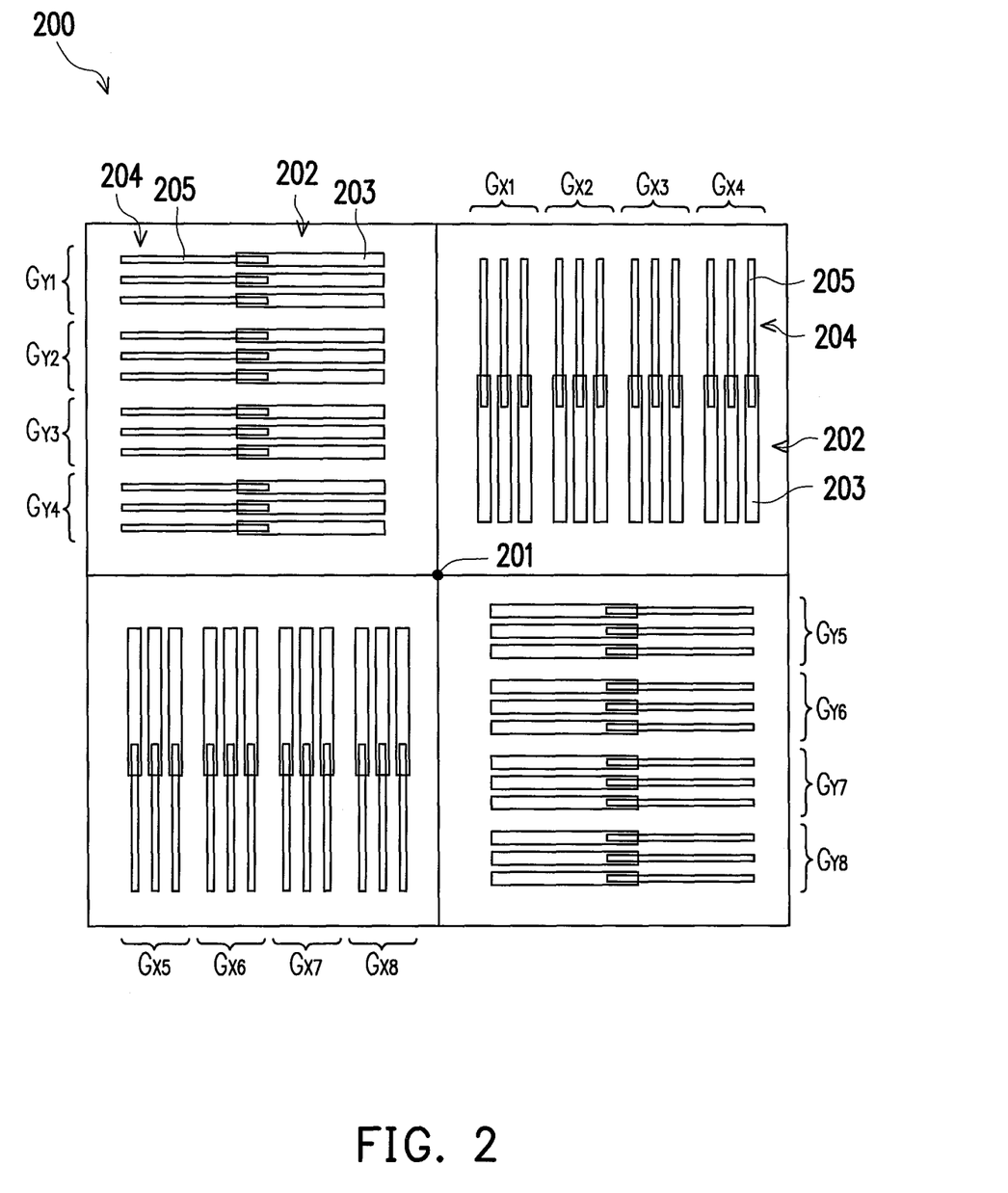
FIG. 2 illustrates a schematic top view of an overlay mark according to a second embodiment of the present invention.

FIG. 2 illustrates a schematic top view of an overlay mark according to a second embodiment of the present invention.

The overlay mark 200 of the invention includes a plurality of patterns 203 of a previous layer 202 and a plurality of patterns 205 of a current layer 204. The patterns 203 of the previous layer 202 are substantially arranged symmetrical with respect to a central point 201, and the second patterns 205 of the current layer 204 are substantially arranged symmetrical with respect to the central point 201. By such substantially symmetrical design, the overlay mark 200 can be used to measure the alignment accuracy between layers with an optical measurement tool, such as a KLA optical measurement tool.

Besides, the patterns 203 of the previous layer 202 and the patterns 205 of the current layer 204 are divided into, for example but not limited to, sixteen groups $G_{X1}, G_{X2}, \ldots, G_{X8}$ and $G_{Y1}, G_{Y1}, \ldots, G_{Y1}$, as shown in FIG. 2. The groups $G_{X1}, G_{X2}, \ldots, G_{X8}$ are designed to measure the X-direction overlay value, and the groups $G_{Y1}, G_{Y2}, \ldots, G_{Y8}$ are designed to measure the Y-direction overlay value. For each group, the space between the adjacent two patterns 203 is constant, and the space between the adjacent two patterns 205 is constant.

In this embodiment, the patterns 203 can be line patterns or plug patterns (i.e. opening patterns filled with conductors), the patterns 205 can be line patterns, and ends of the patterns 203 correspondingly overlap with ends of the patterns 205. Each group has, for example but not limited to, three patterns 203 of the previous layer 202 and three patterns 205 of the current layer 204. The number of patterns 203 and 205 is not limited by the present invention and can be adjusted upon the process requirements. Besides, the dimension of the patterns 203 is greater than the dimension of the patterns 205. By such partially overlapped design, the overlay mark 200 can be used to measure the alignment accuracy between layers with an electrical measurement tool, such as a CD-SEM, a cross-sectional SEM, a TEM, an atomic force microscope (AFM) or a high resolution profiler (HRP).

Figure 2A:
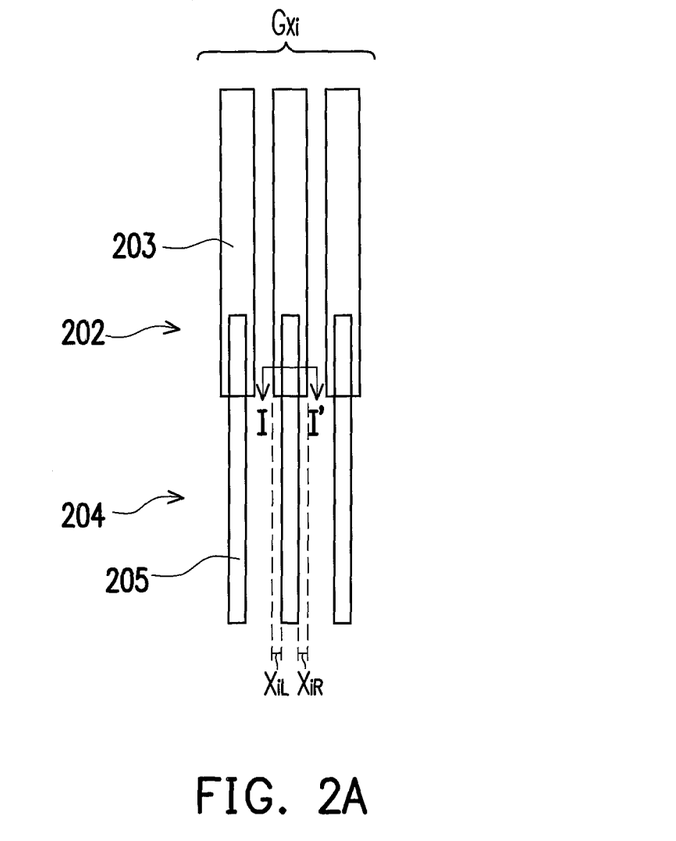
FIG. 2A illustrates an enlarged view of the group Xi of the overlay mark of the second embodiment.
Figure 2B:
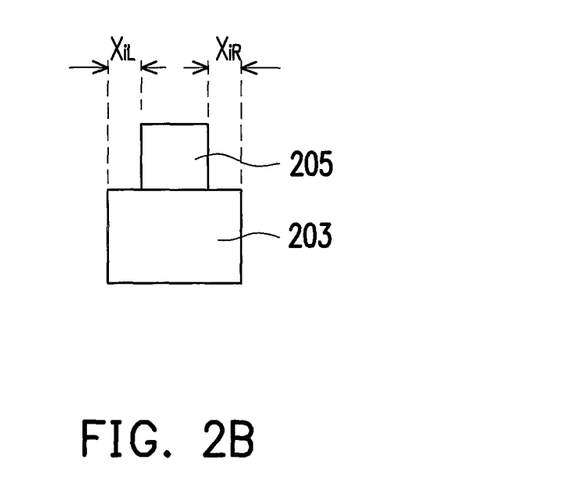
FIG. 2B illustrates a cross-sectional view taken along the line I-I' in FIG. 2A.
Figure 2C:
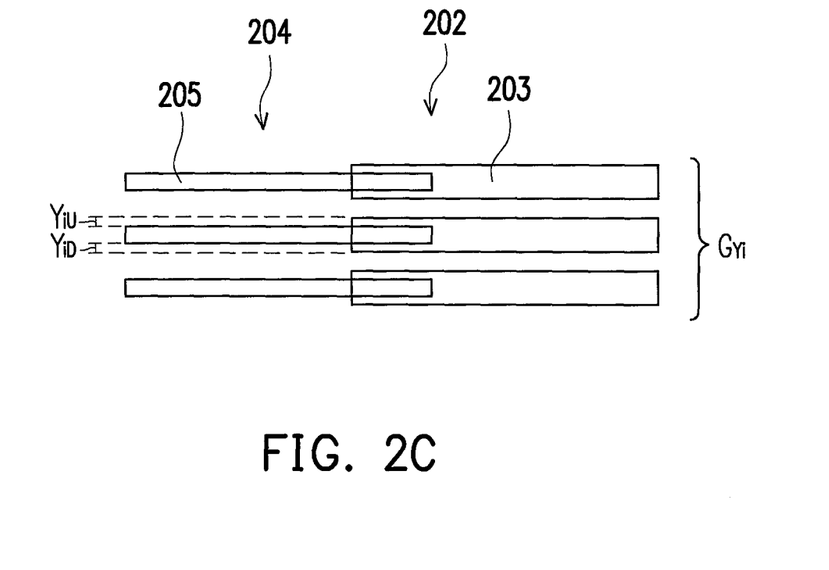
FIG. 2C illustrates an enlarged view of the group Yi of the overlay mark of the second embodiment.

FIG. 2A illustrates an enlarged view of the group Xi of the overlay mark 200, and FIG. 2B illustrates a cross-sectional view taken along the line I-I' in FIG. 2A. FIG. 2C illustrates an enlarged view of the group Yi of the overlay mark 200.

Referring to FIG. 2A and FIG. 2B, the X-direction overlay value of group $G_{Xi}$ (overlay $X_i$) is calculated by the following equation:

$$\text{Overlay } X_i = (X_{iR} - X_{iL})/2$$

wherein $X_{iR}$ is a distance from a boundary of a pattern 203 to a boundary of the corresponding pattern 205 at the right-hand side, $X_{iL}$ is a distance from another boundary of the pattern 203 to another boundary of the corresponding pattern 205 at the left-hand side, and i is an positive integer.

When overlay mark 200 has N groups for measuring the X-direction overlay value, the average X-direction overlay value (Overlay $X_{AVE}$) can be calculated by the following equation:

$$\text{Overlay } X_{AVE} = (X_1 + X_2 + \ldots + X_N)/N$$

wherein N is a positive integer.

Similarly, Referring to FIG. 2C, the Y-direction overlay value of group $G_{Yi}$ (overlay $Y_i$) is calculated by the following equation:

$$\text{Overlay } Y_i = (Y_{iU} - Y_{iD})/2$$

wherein $Y_{iU}$ is a distance from a boundary of a pattern 203 to a boundary of the corresponding pattern 205 at the up side, $Y_{iD}$ is a distance from another boundary of the pattern 203 to the adjacent pattern 205 at the down side, and i is an positive integer.

When overlay mark 200 has N groups for measuring the Y-direction overlay value, the average Y-direction overlay value (Overlay $Y_{AVE}$) can be calculated by the following equation:

$$\text{Overlay } Y_{AVE} = (Y_1 + Y_2 + \ldots + Y_N)/N$$

wherein N is a positive integer.

In this embodiment, the overlay mark 200 has eight groups $(G_{X1}, G_{X2}, \ldots, G_{X8})$ for measuring the X-direction overlay value and eight groups $(G_{Y1}, G_{Y2}, \ldots, G_{Y8})$ for measuring the Y-direction overlay value, so that the average X-direction overlay value (Overlay $X_{AVE}$) and the average Y-direction overlay value (Overlay $Y_{AVE}$) can be calculated by the following equations:

$$\text{Overlay } X_{AVE} = (X_1 + X_2 + X_3 + X_4 + X_5 + X_6 + X_7 + X_8)/8$$

$$\text{Overlay } Y_{AVE} = (Y_1 + Y_2 + Y_3 + Y_4 + Y_5 + Y_6 + Y_7 + Y_8)/8$$

Third Embodiment

Figure 3:
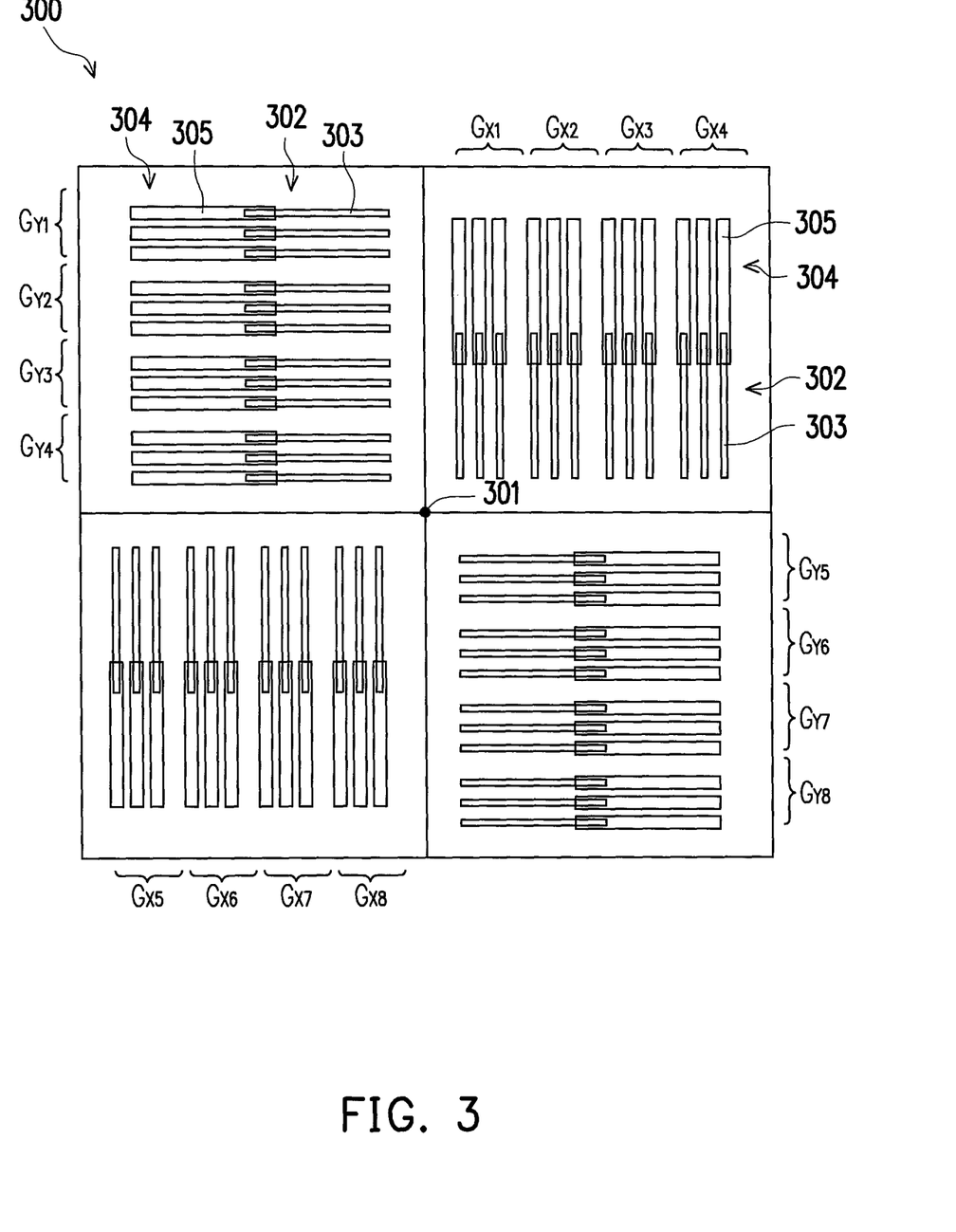
FIG. 3 illustrates a schematic top view of an overlay mark according to a third embodiment of the present invention.

FIG. 3 illustrates a schematic top view of an overlay mark according to a third embodiment of the present invention.

The overlay mark 300 of the invention includes a plurality of patterns 303 of a previous layer 302 and a plurality of patterns 305 of a current layer 304. The patterns 303 of the previous layer 302 are substantially arranged symmetrical with respect to a central point 301, and the second patterns 305 of the current layer 304 are substantially arranged symmetrical with respect to the central point 301. By such substantially symmetrical design, the overlay mark 300 can be used to measure the alignment accuracy between layers with an optical measurement tool, such as a KLA optical measurement tool.

Besides, the patterns 303 of the previous layer 302 and the patterns 305 of the current layer 204 are divided into, for example but not limited to, sixteen groups $G_{X1}, G_{X2}, \ldots, G_{X8}$ and $G_{Y1}, G_{Y1}, \ldots, G_{Y1}$, as shown in FIG. 3. The groups $G_{X1}, G_{X2}, \ldots, G_{X8}$ are designed to measure the X-direction overlay value, and the groups $G_{Y1}, G_{Y2}, \ldots, G_{Y8}$ are designed to measure the Y-direction overlay value. For each group, the space between the adjacent two patterns 303 is constant, and the space between the adjacent two patterns 305 is constant.

In this embodiment, the patterns 303 can be line patterns or plug patterns (i.e. opening patterns filled with conductors), the patterns 305 can be space patterns, and ends of the patterns 303 correspondingly overlap with ends of the patterns 305. Each group has, for example but not limited to, three patterns 303 of the previous layer 302 and three patterns 305 of the current layer 304. The number of patterns 303 and 305 is not limited by the present invention and can be adjusted upon the process requirements. Besides, the dimension of the patterns 303 is smaller than the dimension of the patterns 305. By such partially overlapped design, the overlay mark 300 can be used to measure the alignment accuracy between layers with an electrical measurement tool, such as a CD-SEM, a cross-sectional SEM, a TEM, an atomic force microscope (AFM) or a high resolution profiler (HRP).

Figure 3A:
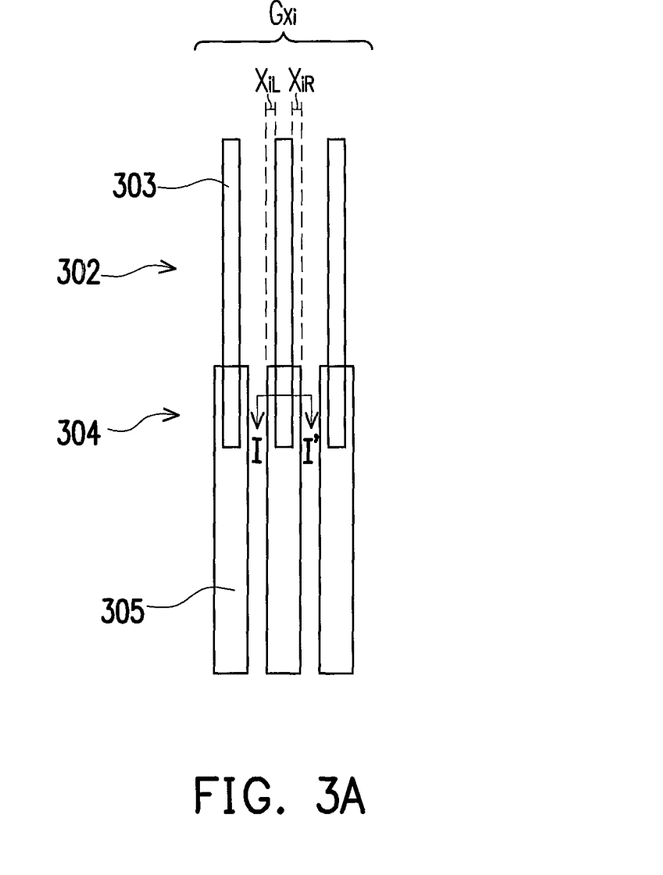
FIG. 3A illustrates an enlarged view of the group Xi of the overlay mark of the third embodiment.
Figure 3B:
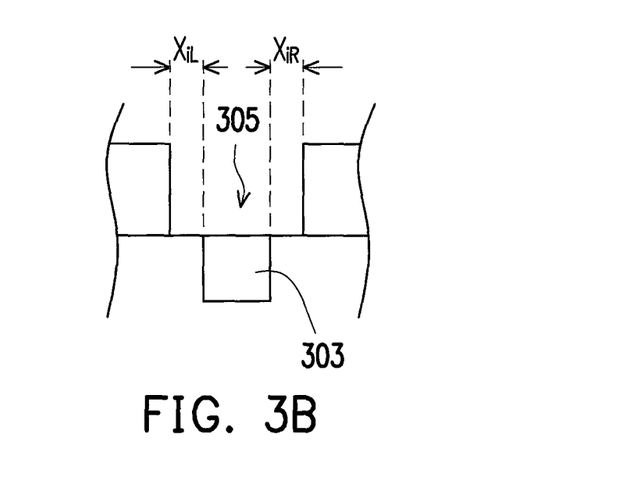
FIG. 3B illustrates a cross-sectional view taken along the line I-I' in FIG. 3A.
Figure 3C:
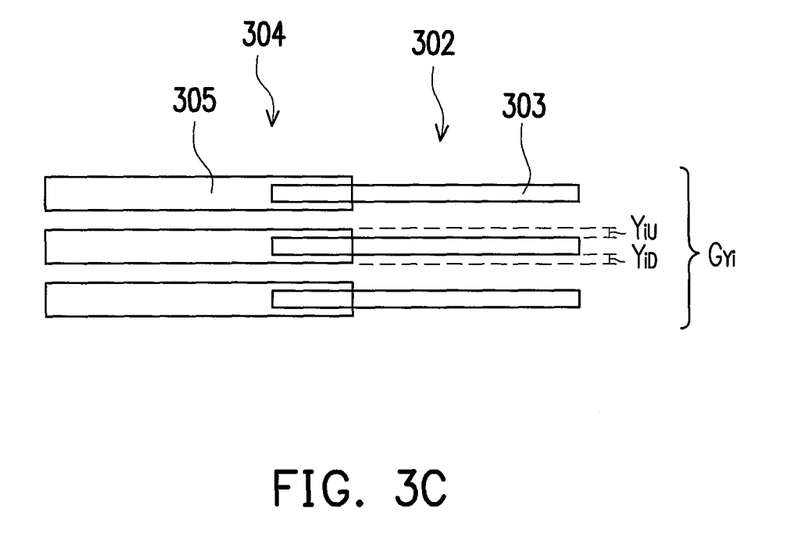
FIG. 3C illustrates an enlarged view of the group Yi of the overlay mark of the third embodiment.

FIG. 3A illustrates an enlarged view of the group Xi of the overlay mark 300, and FIG. 3B illustrates a cross-sectional view taken along the line I-I' in FIG. 3A. FIG. 3C illustrates an enlarged view of the group Yi of the overlay mark 300.

Referring to FIG. 3A and FIG. 3B, the X-direction overlay value of group $G_{Xi}$ (overlay $X_i$) is calculated by the following equation:

$$\text{Overlay } X_i = (X_{iR} - X_{iL})/2$$

wherein $X_{iR}$ is a distance from a boundary of a pattern 303 to a boundary of the corresponding pattern 305 at the right-hand side, $X_{iL}$ is a distance from another boundary of the pattern 303 to another boundary of the corresponding pattern 305 at the left-hand side, and i is an positive integer.

When overlay mark 300 has N groups for measuring the X-direction overlay value, the average X-direction overlay value (Overlay $X_{AVE}$) can be calculated by the following equation:

$$\text{Overlay } X_{AVE}=(X_1+X_2+\ldots+X_N)/N$$

wherein N is a positive integer.

Similarly, Referring to FIG. 3C, the Y-direction overlay value of group $G_{Yi}$ (overlay $Y_i$) is calculated by the following equation:

$$\text{Overlay } Y_i=(Y_{iU}-X_{iD})/2$$

wherein $Y_{iU}$ is a distance from a boundary of a pattern 303 to a boundary of the corresponding pattern 305 at the up side, $Y_{iD}$ is a distance from another boundary of the pattern 303 to the adjacent pattern 305 at the down side, and i is an positive integer.

When overlay mark 300 has N groups for measuring the Y-direction overlay value, the average Y-direction overlay value (Overlay $Y_{AVE}$) can be calculated by the following equation:

$$\text{Overlay } Y_{AVE}=(Y_1+Y_2+\ldots+Y_N)/N$$

wherein N is a positive integer.

In this embodiment, the overlay mark 300 has eight groups ($G_{X1}, G_{X2}, \ldots, G_{X8}$) for measuring the X-direction overlay value and eight groups ($G_{Y1}, G_{Y2}, \ldots, G_{Y8}$) for measuring the Y-direction overlay value, so that the average X-direction overlay value (Overlay $X_{AVE}$) and the average Y-direction overlay value (Overlay $Y_{AVE}$) can be calculated by the following equations:

$$\text{Overlay } X_{AVE}=(X_1+X_2+X_3+X_4+X_5+X_6+X_7+X_8)/8$$

$$\text{Overlay } Y_{AVE}=(Y_1+Y_2+Y_3+Y_4+Y_5+Y_6+Y_7+Y_8)/8$$

In the said embodiments, the dimension of the patterns 103/203/303 is proportional to the critical dimension of the previous layer 102/202/302, and the dimension of the patterns 105/205/305 is proportional to the critical dimension of the current layer 104/204/304. For example, the dimension of the patterns 103/203/303 is the critical dimension of the previous layer 102/202/302, and the dimension of the patterns 105/205/305 is the critical dimension of the current layer 104/204/304. Besides, in the said embodiments, the X-direction overlay value (Overlay $X_{AVE}$) can be the same as or different from the Y-direction overlay value (Overlay $Y_{AVE}$).

Fourth Embodiment

Figure 4:
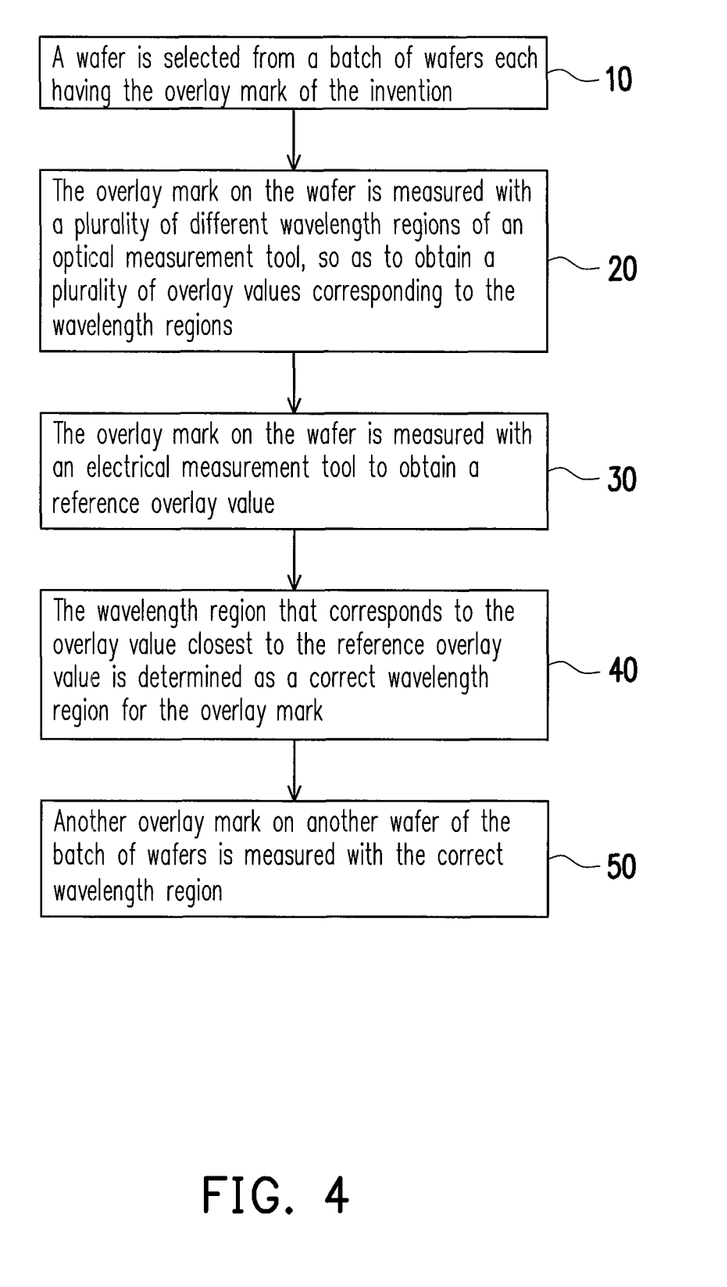
FIG. 4 illustrates a process flow of a measurement of an overlay mark according to a fourth embodiment of the present invention.

FIG. 4 illustrates a process flow of a measurement of an overlay mark according to a fourth embodiment of the present invention.

Referring to FIG. 4, in step 10, a wafer is selected from a batch of wafers. Each wafer has the overlay mark of the invention, such as the overlay mark 100 or 200 or 300.

In step 20, the overlay mark on the wafer is measured with a plurality of different wavelength regions of an optical measurement tool, so as to obtain a plurality of overlay values corresponding to the wavelength regions. The optical measurement tool can be a KLA optical measurement tool.

In an embodiment, the wavelength regions are all between 200 nm to 700 nm. Provided are, for example but not limited to, ten wavelength regions between 200 nm to 700 nm, and any two adjacent wavelength regions partially overlap with each other. In such case, ten different overlay values corresponding to the ten wavelength regions are obtained.

In step 30, the overlay mark on the wafer is measured with an electrical measurement tool to obtain a reference overlay value. The electrical measurement tool includes a CD-SEM, a cross-sectional SEM, a TEM, an atomic force microscope (AFM) or a high resolution profiler (HRP). The measurement methods have been described in Embodiments 1-3, and are not iterated herein.

In step 40, the wavelength region that corresponds to the overlay value closest to the reference overlay value is determined as a correct wavelength region for the overlay mark.

In step 50, another overlay mark on another wafer of the batch of wafers is measured with the correct wavelength region. Specifically, once the correct wavelength region of the optical measurement tool for the overlay mark of the selected wafer is determined through steps 10-40, other wafers of the batch of wafers can be measured with the correct wavelength region, and thus, all the measured overlay values are accurate and correct.

The said embodiments in which the overlay value includes an X-direction overlay value and a Y-direction overlay value are provided for illustration purposes and are not construed as limiting the present invention. In another embodiment, the overlay value can include a first overlay value in a first direction and a second overlay value in a second direction different from the first direction. In an embodiment, the second direction is perpendicular to the first direction. Besides, the first overlay value can be the same as or different from the second overlay value.

In summary, the overlay mark of the invention can be measured by both an in-line optical overlay tool (such as KLA) and an electrical measurement tool (such as CD-SEM). The overlay mark of the invention is very competitive since it is multi-functional and is capable of meeting the customer requirements. Besides, with the measurement method of the invention, a correct wavelength region of an optical overlay tool for an overlay mark is determined. Therefore, the overlay data is reliable and accurate since the overlay mark is measured with the correct wavelength region.

In addition to the in-line optical overlay measurement (such as implemented by KLA) and electrical overlay measurement (such as implemented by CD-SEM), the overlay mark of the present invention is suitable for a transmission electron microscopy (TEM) or a cross-sectional SEM analysis. When a TEM or a cross-sectional SEM analysis is implemented, the misalignment between layers can be easily observed, as shown in FIGS. 2B and 3B. The said overlay values measured by KLA, CD-SEM, TEM and cross-sectional SEM can be obtained from the overlay mark at the same position, so as to confirm/calibrate the in-line overlay data.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A measurement method of an overlay mark, comprising:
    measuring an overlay mark on a wafer with a plurality of different wavelength regions of an optical measurement tool, so as to obtain a plurality of overlay values corresponding to the wavelength regions;
    measuring the overlay mark on the wafer with an electrical measurement tool to obtain a reference overlay value; and determining, as a correct wavelength region for the overlay mark, the wavelength region that corresponds to the overlay value closest to the reference overlay value.

2. The measurement method of claim 1, wherein any two adjacent wavelength regions partially overlap with each other.

3. The measurement method of claim 1, wherein the wavelength regions are all between 200 nm to 700 nm.

4. The measurement method of claim 1, wherein the electrical measurement tool comprises a CD-SEM, a cross-sectional SEM, a TEM, an atomic force microscope (AFM) or a high resolution profiler (HRP).

5. The measurement method of claim 1, wherein the overlay mark comprises a plurality of first patterns of a previous layer and a plurality of second patterns of a current layer, and first ends of the first patterns and second ends of the second patterns are arranged alternately or overlap with each other.

6. The measurement method of claim 5, wherein when the first and second patterns are line patterns, the first ends of the first patterns and the second ends of the second patterns are arranged alternately.

7. The measurement method of claim 5, wherein when the first and second patterns are line patterns, the first ends of the first patterns and the second ends of the second patterns overlap with each other, and a dimension of the first patterns is greater than a dimension of the second patterns.

8. The measurement method of claim 5, wherein when the first patterns are plug patterns and the second patterns are line patterns, the first ends of the first patterns and the second ends of the second patterns overlap with each other, and a dimension of the first patterns is greater than a dimension of the second patterns.

9. The measurement method of claim 5, wherein when the first patterns are plug patterns and the second patterns are space patterns, the first ends of the first patterns and the second ends of the second patterns overlap with each other, and a dimension of the first patterns is smaller than a dimension of the second patterns.

10. The measurement method of claim 5, wherein when the first patterns are line patterns and the second patterns are space patterns, the first ends of the first patterns and the second ends of the second patterns overlap with each other, and a dimension of the first patterns is smaller than a dimension of the second patterns.

11. The measurement method of claim 5, wherein the first patterns are substantially arranged symmetrical with respect to a central point, and the second patterns are substantially arranged symmetrical with respect to the central point.

12. The measurement method of claim 5, wherein a dimension of the first patterns is proportional to a critical dimension of the previous layer, and a dimension of the second patterns is proportional to a critical dimension of the current layer.

13. The measurement method of claim 5, wherein a dimension of the first patterns is a critical dimension of the previous layer, and a dimension of the second patterns is a critical dimension of the current layer.

14. The measurement method of claim 1, wherein the wafer is selected from a batch of wafers, and the measurement method further comprises measuring another overlay mark on another wafer of the batch of wafers with the correct wavelength region.

15. The measurement method of claim 1, wherein the overlay value comprises a first overlay value in a first direction and a second overlay value in a second direction different from the first direction.

16. The measurement method of claim 15, wherein the second direction is perpendicular to the first direction.

17. The measurement method of claim 15, wherein the first overlay value is different from the second overlay value.

18. The measurement method of claim 1, wherein the overlay value comprises an X-direction overlay value and a Y-direction overlay value.

19. The measurement method of claim 18, wherein the X-direction overlay value is different from the Y-direction overlay value.

* * * * *